(12) United States Patent
Goto et al.

(10) Patent No.: US 10,985,716 B2
(45) Date of Patent: Apr. 20, 2021

(54) AUDIO PROCESSING DEVICE AND METHOD FOR CONTROLLING AUDIO PROCESSING DEVICE

(71) Applicant: YAMAHA CORPORATION, Hamamatsu (JP)

(72) Inventors: Mitsutaka Goto, Hamamatsu (JP); Kazuhiro Yanaike, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 16/684,731

(22) Filed: Nov. 15, 2019

(65) Prior Publication Data
US 2020/0083851 A1 Mar. 12, 2020

Related U.S. Application Data

(63) Continuation of application No. PCT/JP2017/018876, filed on May 19, 2017.

(51) Int. Cl.
*H03F 3/217* (2006.01)
*H03F 1/02* (2006.01)
*H04R 3/04* (2006.01)

(52) U.S. Cl.
CPC ......... *H03F 3/2171* (2013.01); *H03F 1/0211* (2013.01); *H04R 3/04* (2013.01);
(Continued)

(58) Field of Classification Search
CPC ........... H04R 3/04; H04R 3/007; H03F 3/217; H03F 3/2171; H03F 1/0211;
(Continued)

(56) References Cited

U.S. PATENT DOCUMENTS 6,683,494 B2  1/2004  Stanley
9,263,992 B1*  2/2016  Breece, III ............ H03F 3/2173
(Continued)

FOREIGN PATENT DOCUMENTS

JP   H07288444 A   10/1995
JP   H10126893 A   5/1998
(Continued)

OTHER PUBLICATIONS

International Search Report issued in Intl. Appln No. PCT/JP2017/018876 dated Aug. 8, 2017. English translation provided.
(Continued)

*Primary Examiner* — Jason R Kurr
(74) *Attorney, Agent, or Firm* — Rossi, Kimms & McDowell LLP

(57) ABSTRACT

An audio processing device includes: at least one processor configured to: generate a first signal by reducing components that fall below a first frequency in an audio signal; generate a second signal by reducing components that fall below a second frequency that is higher than the first frequency in the audio signal; select between a first state for outputting the first signal and a second state for outputting the second signal; and output one of the selected first or second signal as an output signal; and a class-D amplifier configured to amplify the output signal, in which, the at least one processor is further configured to: determine whether or not a power supply pumping phenomenon exists or a possibility of the power supply pumping phenomenon exists, in a power source that supplies a power supply voltage to the class-D amplifier; and in which, in the selecting between the first state and the second state, the at least one processor is configured to select: the first state in a case where a determination result is negative, where the power supply pumping phenomenon is determined to not exist or the possibility of the power supply pumping phenomenon is determined to not exist; and the second state in a case where the determination result is affirmative, where the power supply pumping phenomenon is determined to exist or the possibility of the power supply pumping phenomenon is determined to exist.

8 Claims, 12 Drawing Sheets

(52) U.S. Cl.
CPC .... *H03F 2200/03* (2013.01); *H03F 2200/165* (2013.01); *H03F 2200/267* (2013.01); *H03F 2200/351* (2013.01)

(58) Field of Classification Search
CPC .......... H03F 2200/03; H03F 2200/165; H03F 2200/267; H03F 2200/351
See application file for complete search history.

(56) References Cited

U.S. PATENT DOCUMENTS

| | | | | |
|---|---|---|---|---|
| 2014/0301577 A1* | 10/2014 | Togawa | ................... | H03F 3/68 381/120 |
| 2015/0109056 A1* | 4/2015 | Lesso | ................... | H03F 1/0211 330/251 |

FOREIGN PATENT DOCUMENTS

| | | | |
|---|---|---|---|
| JP | 2005509306 | A | 4/2005 |
| JP | 2009239505 | A | 10/2009 |
| JP | 6233309 | B2 | 7/2013 |
| JP | 2014154959 | A | 8/2014 |
| WO | 02078179 | A2 | 10/2002 |

OTHER PUBLICATIONS

Written Opinion issued in Intl. Appln. No. PCT/JP2017/018876 dated Aug. 8, 2017.
Office Action issued in Japanese Appln. No. 2019-518720 dated Jul. 7, 2020. English machine translation provided.

* cited by examiner

AUDIO PROCESSING DEVICE AND METHOD FOR CONTROLLING AUDIO PROCESSING DEVICE

CROSS REFERENCE TO RELATED APPLICATION

This Application is a Continuation Application of PCT Application No. PCT/JP2017/018876, filed May 19, 2017, the entire contents of which are incorporated herein by reference.

BACKGROUND

Field of the Invention

The present invention relates to a technique for processing audio signals.

Description of Related Art

There has been proposed a class-D amplifier including a Pulse Width Modulation (PWM) circuit for modulating an audio signal to a binary signal, a switch circuit that is switched by the modulated binary signal, and a low-pass filter for reducing a high-frequency component in the output signal from the switch circuit. In a half-bridge type (single-end type) class-D amplifier, the low-pass filter has an inductor, and a smoothing capacitor of the power supply voltage may be overcharged by a regenerative current from the inductor constituting the low-pass filter. As a result, a phenomenon in which the power supply voltage fluctuates (hereinafter referred to as "power supply pumping phenomenon") may occur.

Japanese Patent No. 5233309 (hereinafter, Patent Document 1) discloses a class-D power amplifier that reduces a fluctuation in power supply voltage due to a power supply pumping phenomenon, by controlling a cutoff frequency of a high-pass filter for reducing a low-frequency component of an input audio signal. Specifically, the fluctuation in the power supply voltage is monitored to determine whether or not there is an on-going power supply pumping phenomenon. When a power supply pumping phenomenon occurs, the cutoff frequency of the high-pass filter is increased stepwise, thereby reducing the fluctuation in the power supply voltage due to the power supply pumping phenomenon.

However, in the technique of Patent Document 1, there is a problem in that a processing load is relatively large since it is necessary to calculate coefficients of the high-pass filter in a time series when the power supply pumping phenomenon occurs.

SUMMARY

In view of the above circumstances, an object of the present invention is to reduce a load for reducing (ideally eliminating) fluctuation in a power supply voltage due to a power supply pumping phenomenon.

In order to solve the above problem, an audio processing device according to an aspect of the present invention includes: at least one processor configured to: generate a first signal by reducing components that fall below a first frequency in an audio signal; generate a second signal by reducing components that fall below a second frequency that is higher than the first frequency in the audio signal; select between a first state for outputting the first signal and a second state for outputting the second signal; and output one of the selected first or second signal as an output signal; and a class-D amplifier configured to amplify the output signal, in which, the at least one processor is further configured to: determine whether or not a power supply pumping phenomenon exists or a possibility of the power supply pumping phenomenon exists, in a power source that supplies a power supply voltage to the class-D amplifier; and in which, in the selecting between the first state and the second state, the at least one processor is configured to select: the first state in a case where a determination result is negative, where the power supply pumping phenomenon is determined to not exist or the possibility of the power supply pumping phenomenon is determined to not exist; and the second state in a case where the determination result is affirmative, where the power supply pumping phenomenon is determined to exist or the possibility of the power supply pumping phenomenon is determined to exist.

An aspect of the present invention provides a method of controlling an audio processing device including: at least one processor configured to: generate a first signal by reducing components that fall below a first frequency in an audio signal; generate a second signal by reducing components that fall below a second frequency that is higher than the first frequency in the audio signal; select between a first state for outputting the first signal and a second state for outputting the second signal; and output one of the selected first or second signal as an output signal, and a class-D amplifier configured to amplify the output signal, in which, the method includes: determining whether or not a power supply pumping phenomenon exists or a possibility of the power supply pumping phenomenon exists, in a power source that supplies a power supply voltage to the class-D amplifier; selecting the first state in a case where a determination result is negative, where the power supply pumping phenomenon is determined to not exist or the possibility of the power supply pumping phenomenon is determined to not exist; and selecting the second state in a case where the determination result is affirmative, where the power supply pumping phenomenon is determined to exist or the possibility of the power supply pumping phenomenon is determined to exist.

DESCRIPTION OF THE EMBODIMENTS

First Embodiment

Figure 1:
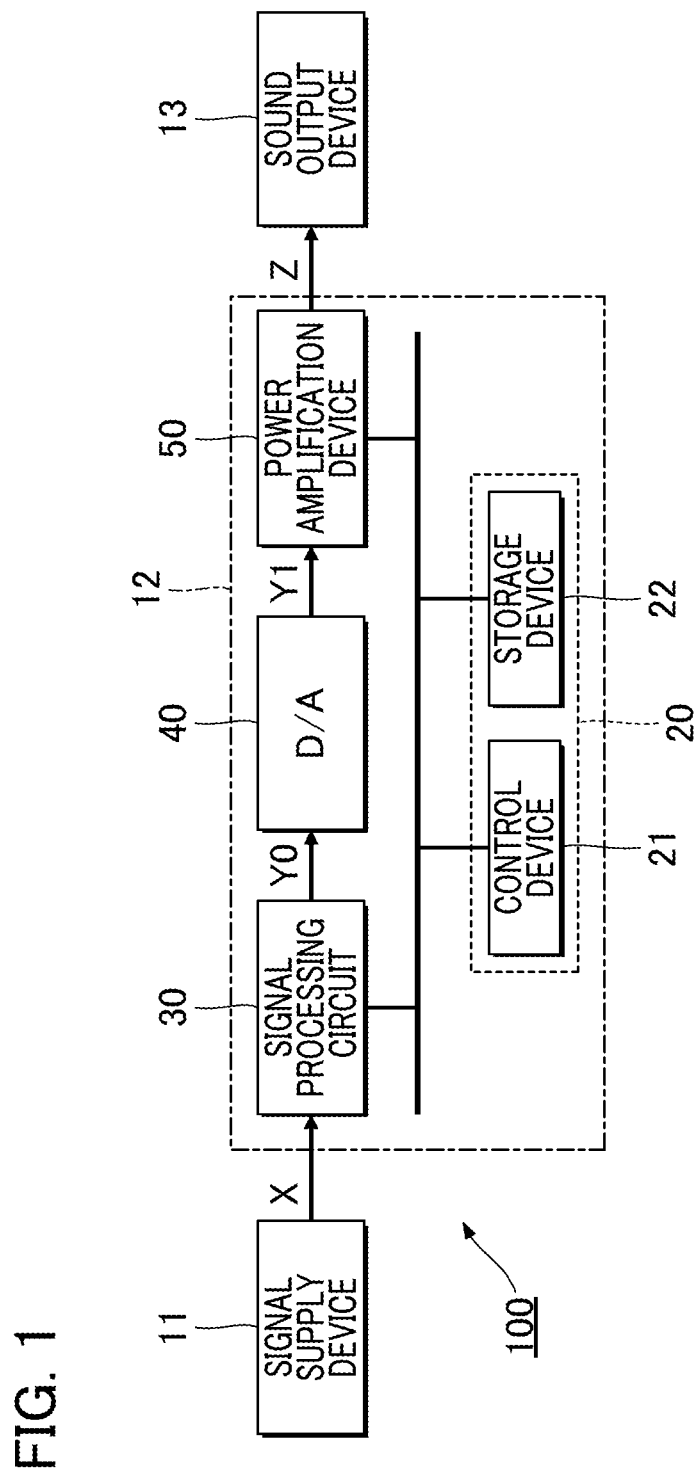
FIG. 1 is a block diagram of an audio system according to a first embodiment of the present invention.

FIG. 1 is a block diagram of an audio system 100 according to a first embodiment of the present invention. As shown in FIG. 1, the audio system 100 according to the first embodiment is a computer system for playing various sounds such as musical sounds, vocal sounds, or the like. The audio system 100 includes a signal supply device 11, an audio processing device 12, and a sound output device 13. Any two or more elements of the audio system 100 may be formed unitarily. For example, the signal supply device 11 may be mounted on the audio processing device 12.

The signal supply device 11 is a signal source that supplies a digital audio signal X representing various sounds, such as vocal sounds or musical sounds, to the audio processing device 12. Examples of the signal supply device 11 include a player that reads an audio signal X from a portable or built-in recording medium. Alternatively, there may be used, as the signal supply device 11, a sound collecting device that collects sound in the periphery to generate an audio signal X or a communication device that receives an audio signal X from another device via a communication network.

The audio processing device 12 processes the audio signal X supplied from the signal supply device 11 to generate an audio signal Z. The sound output device 13 is, for example, a speaker or a headphone. The sound output device 13 plays sound representative of the audio signal Z generated by the audio processing device 12.

As shown in FIG. 1, the audio processing device 12 includes a control unit 20, a signal processing circuit 30, a D/A converter 40, and a power amplification device 50. The audio signal X output from the signal supply device 11 is supplied to the signal processing circuit 30. In a case where an output of the signal supply device 11 is an analog audio signal X, there may be provided an A/D converter (not shown) that converts the audio signal X from analog to digital. In this case, the signal processing circuit 30 receives a supply of the digital audio signal X converted by the A/D converter.

The control unit 20 is a controller configured to control each element of the audio processing device 12. The control unit 20 includes a control device 21 and a storage device 22. The control device 21 is an arithmetic processing circuit such as a Central Processor Unit (CPU), for example. The control device 21 controls the signal processing circuit 30 and the power amplification device 50 by executing a program stored in the storage device 22. The storage device 22 stores therein a program to be executed by the control device 21 and various data used by the control device 21. For example, there may be used, as the storage device 22, a known recording medium, such as a semiconductor recording medium or a magnetic recording medium, or a combination of a plurality of types of recording media.

The signal processing circuit 30 is configured by, for example, a Digital Signal Processor (DSP) for audio signal processing. The signal processing circuit 30 performs signal processing on the audio signal X supplied from the signal supply device 11, to generate an audio signal Y0. Examples of the signal processing performed by the signal processing circuit include crossover processing for dividing the audio signal X into bands, delay processing for delaying the audio signal X, equalizer processing for adjusting the frequency characteristics of the audio signal X, limiter processing for limiting a voltage range of an audio signal X, or howling suppression processing for suppressing howling. A part of, or all of, the functions of the signal processing circuit 30 may be realized by the control device 21.

The D/A converter 40 in FIG. 1 converts the digital audio signal Y0 generated by the signal processing circuit 30 into an analog audio signal Y1. The power amplification device 50 generates an audio signal Z by amplifying the audio signal Y1. The sound output device 13 receives a supply of the audio signal Z amplified by the power amplification device 50.

Figure 2:
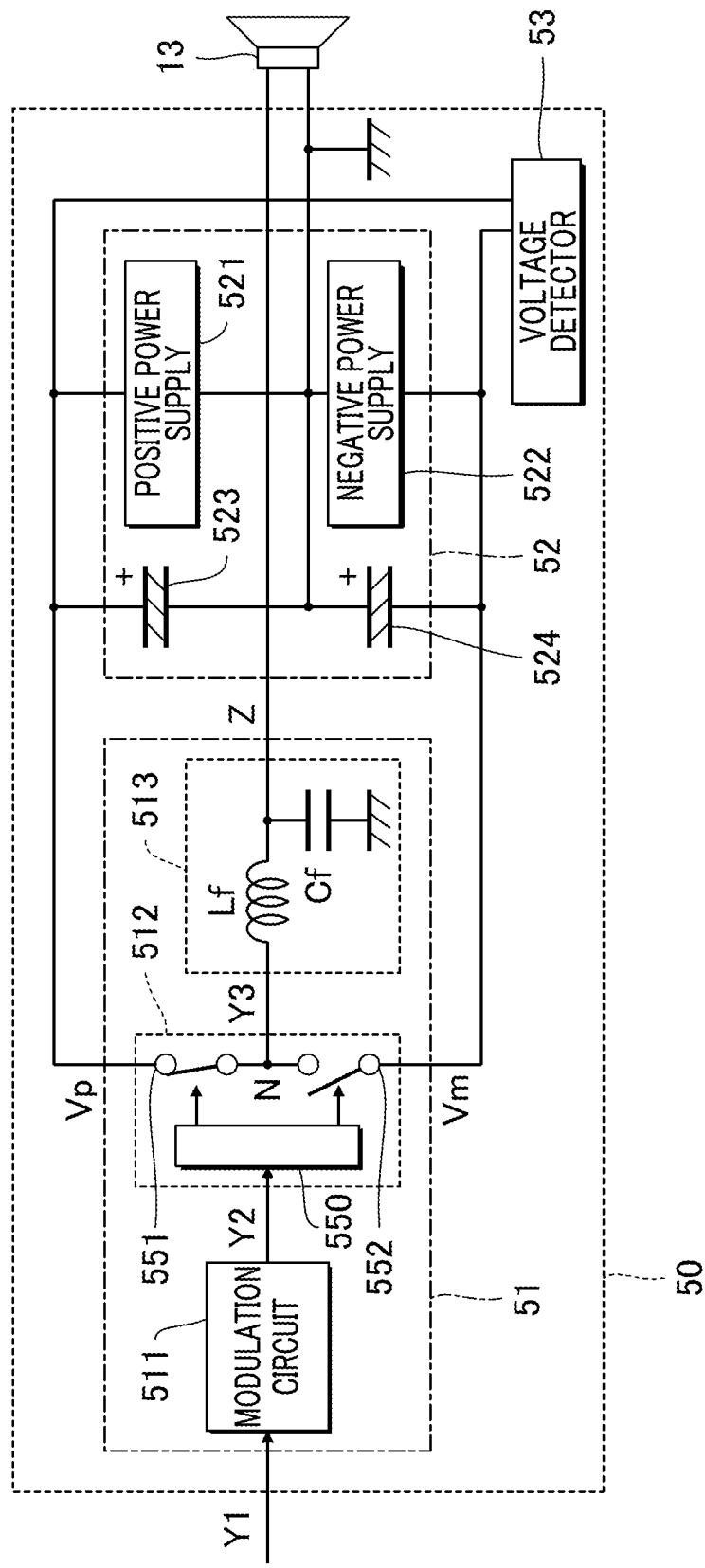
FIG. 2 is a block diagram showing a power amplification device.

FIG. 2 is a block diagram showing the power amplification device 50. As shown in FIG. 2, the power amplification device 50 according to the first embodiment includes a class-D amplifier 51, a power source 52, and a voltage detector 53. The class-D amplifier 51 amplifies the audio signal Y1 supplied from the D/A converter 40 to generate an audio signal Z. The power source 52 supplies power to the class-D amplifier 51. Specifically, the class-D amplifier 51 receives supplies of a positive power supply voltage Vp and a negative power supply voltage Vm from the power source 52. The voltage detector 53 detects the positive power supply voltage Vp and the negative power supply voltage Vm, which are supplied to the class-D amplifier 51 by the power source 52. Specifically, the voltage detector 53 includes an A/D converter (not shown) that generates digital data representing, for example, each of the positive power supply voltage Vp and the negative power supply voltage Vm.

As shown in FIG. 2, the power source 52 includes a positive power supply 521, a negative power supply 522, a smoothing capacitor 523, and a smoothing capacitor 524. The positive power supply 521 generates a positive power supply voltage Vp, and the negative power supply 522 generates a negative power supply voltage Vm. The smoothing capacitor 523 is a capacitance for smoothing the positive power supply voltage Vp. The smoothing capacitor 524 is a capacitance for smoothing the negative power supply voltage Vm. For example, an electrolytic capacitor may be used as the smoothing capacitor 523 and the smoothing capacitor 524.

As shown in FIG. 2, the class-D amplifier 51 according to the first embodiment is a half-bridge type (single-end type) digital amplifier. The class-D amplifier 51 includes a modulation circuit 511, a switching circuit 512, and a low-pass filter 513. The modulation circuit 511 generates a Pulse Width Modulation (PWM) signal Y2 by pulse width modulation with respect to the audio signal Y1. The PWM signal Y2 is a binary signal which fluctuates with a duty ratio corresponding to the level of the audio signal Y1. Specifically, there may be used, as the modulation circuit 511, a PWM circuit of the triangular wave comparison type (other excited oscillation type) which generates the PWM signal Y2 by comparing the audio signal Y1 with the triangular wave, or a self-excited oscillation PWM circuit which generates the PWM signal Y2 by the self-excited oscillation by negative feedback.

The switching circuit 512 amplifies the PWM signal Y2 generated by the modulation circuit 511 by a switching operation, thereby generating an amplified signal Y3. The switching circuit 512 according to the first embodiment includes a drive circuit 550, a first switch 551, and a second switch 552. Each of the first switch 551 and the second switch 552 is a switching element such as a Metal Oxide Semiconductor Field Effect Transistor (MOSFET), for example. The first switch 551 is interposed between the positive power supply 521 and an output point N. The second switch 552 is interposed between the negative power supply 522 and the output point N. The drive circuit 550 controls either of the first switch 551 and the second switch 552 to be in the ON state in accordance with the PWM signal Y2 generated by the modulation circuit 511. Specifically, the drive circuit 550 controls the first switch 551 to be in the ON state when the PWM signal Y2 is at a high level, and controls the second switch 552 to be in the ON state when the PWM signal Y2 is at a low level. When the first switch 551 is controlled to be in the ON state, the positive power supply voltage Vp is applied to the output point N. When the second switch 552 is controlled to be in the ON state, the negative power supply voltage Vm is applied to the output point N. That is, the amplified signal Y3 generated at the output point N is a rectangular wave that changes from one of the positive power supply voltage Vp and the negative power supply voltage Vm to the other at a duty ratio similar to that of the PWM signal Y2.

The low-pass filter 513 generates an audio signal Z obtained by reducing a high-frequency component of the amplified signal Y3 that is generated by the class-D amplifier 51. It is of note that the high-frequency components of the amplified signal Y3 are, for example, the band component including the oscillation frequency of the modulation circuit 511. That is, the low-pass filter 513 extracts the low-frequency component including the audible band from the amplified signal Y3, as the audio signal Z. As shown in FIG. 2, the low-pass filter 513 includes a capacitor Cf and an inductor Lf.

Figure 3:
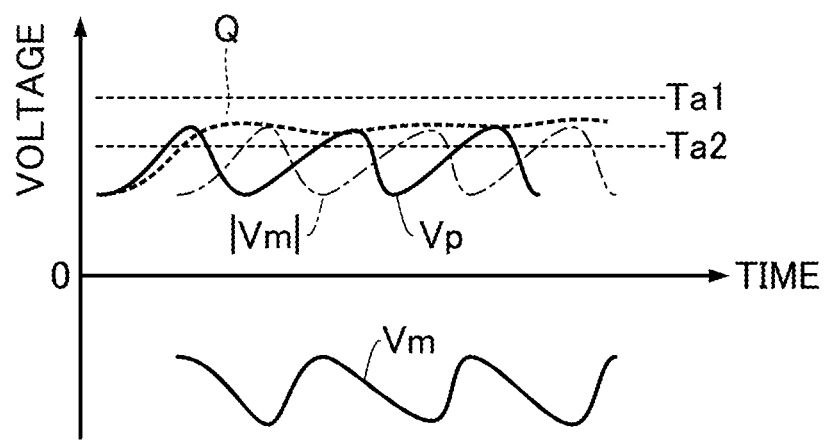
FIG. 3 is an explanatory drawing of a power supply pumping phenomenon and a voltage index value.

In the class-D amplifier 51 having the structure shown above, a power supply pumping phenomenon may occur. The power supply pumping phenomenon will be described below. As shown in FIG. 3, the power supply pumping phenomenon is a phenomenon in which the positive power supply voltage Vp and the negative power supply voltage Vm fluctuate. This phenomenon is caused by overcharging the smoothing capacitor 523 and the smoothing capacitor 524 by a regenerative current from the inductor Lf of the low-pass filter 513. Assuming that a sine wave is supplied to the load (e.g., the sound output device 13) from the class-D amplifier 51, the fluctuation amount ΔV of the negative power supply voltage Vm due to the power supply pumping phenomenon is expressed by the following Equation (1). Although the variation amount of the negative power supply voltage Vm is shown in Equation (1), similar fluctuations may also occur in the positive power supply voltage Vp.

$$\Delta V = \frac{Vs(4Vdd - \pi Vs)}{8\pi f C R_L V} \quad (1)$$

In Equation (1), the symbol Vs is the peak voltage [V] of the sine wave, and the symbol Vdd is the absolute value of the positive power supply voltage Vp or the negative power supply voltage Vm. The symbol f is the frequency [Hz] of the sine wave. Further, the symbol C is a capacitance value [F] of the smoothing capacitor 524, and the symbol RL is a load resistance [Ω]. As will be understood from Equation (1), the lower the frequency of the audio signal Z output from the class-D amplifier 51, the greater the fluctuation amount ΔV (that is, an impact of the power supply pumping phenomenon) of the positive power supply voltage Vp or the negative power supply voltage Vm tends to be increased. Therefore, by reducing the low-frequency component in the audio signal X before amplification by the class-D amplifier 51, it is possible to reduce the fluctuation in the power supply voltage due to the power supply pumping phenomenon. In consideration of the above circumstances, in the first embodiment, the low-frequency component of the audio signal X is reduced when a power supply pumping phenomenon occurs.

Figure 4:
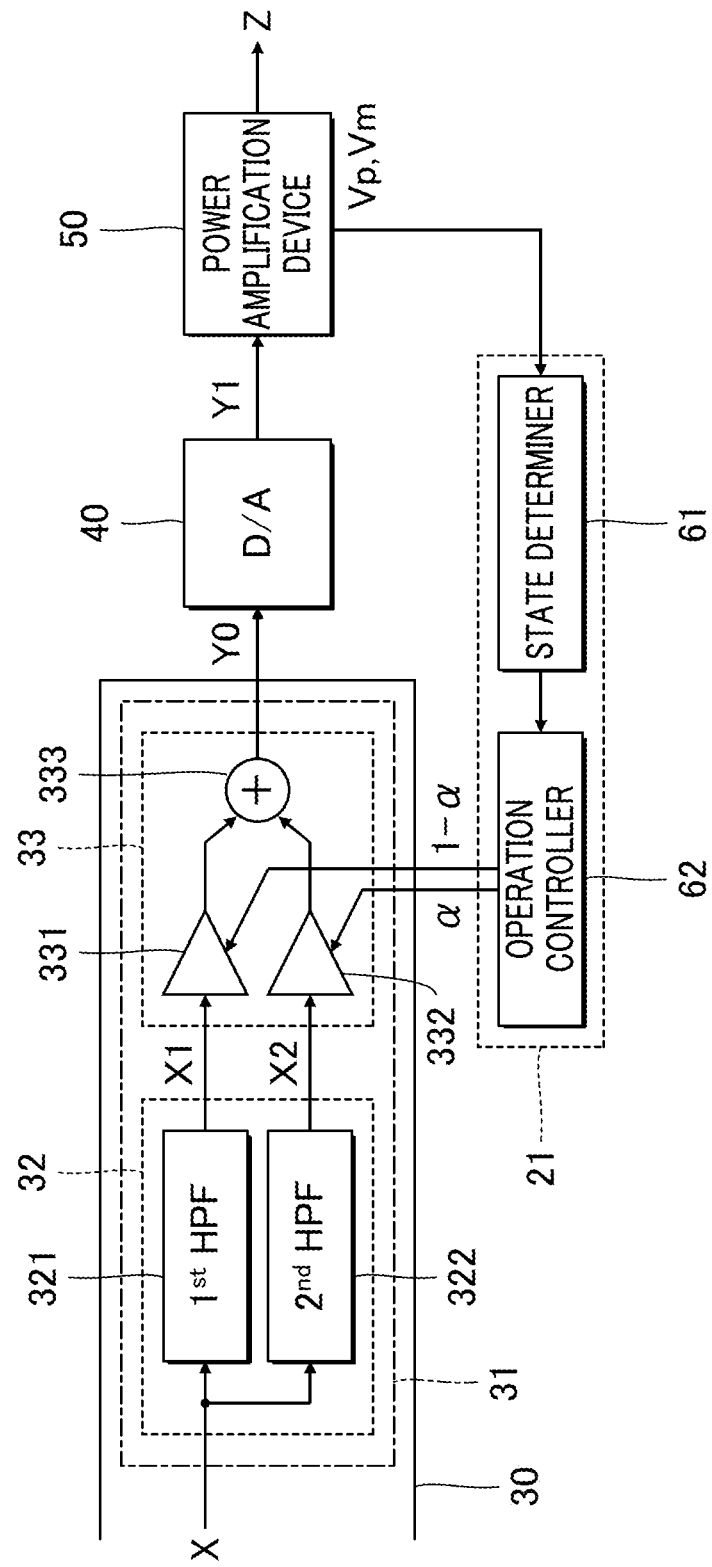
FIG. 4 is a block diagram of an element for reducing a change in a power supply voltage due to a power supply pumping phenomenon.

FIG. 4 is a block diagram of an element in the audio processing device 12 for reducing the fluctuation in the power supply voltage due to the power supply pumping phenomenon. As shown in FIG. 4, the signal processing circuit 30 (an example of "at least one processor") according to the first embodiment includes low-frequency reducer 31 that reduces the low-frequency component of the audio signal X. The audio signal X processed by the low-frequency reducer 31 is the same one generated by the signal processing circuit 30 as described above.

As shown in FIG. 4, the low-frequency reducer 31 according to the first embodiment includes a signal processor 32 and an output controller 33. The signal processor 32 includes a first High-Pass Filter (HPF) 321 and a second High-Pass Filter (HPF) 322. As shown by a broken line in FIG. 5, the first high-pass filter 321 generates a first signal X1 by reducing components that fall below a first frequency F1 in the audio signal X. As shown by a solid line in FIG. 5, the second high-pass filter 322 generates a second signal X2 by reducing components that fall below a second frequency F2 in the audio signal X.

Figure 5:
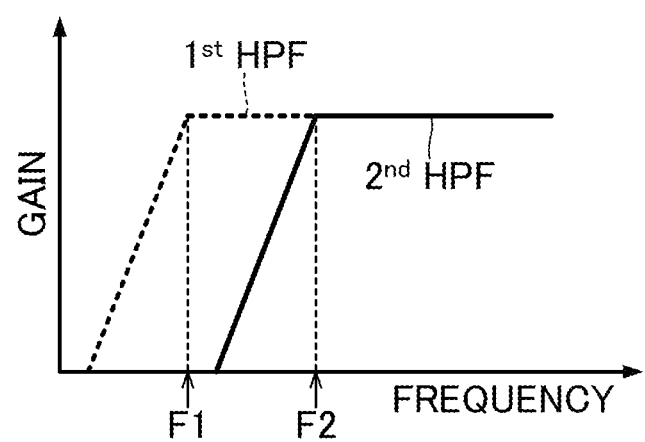
FIG. 5 is a frequency response of a first high-pass filter and a second high-pass filter.

As shown in FIG. 5, the second frequency F2 is higher than the first frequency F1 (F2>F1). For example, the first frequency F1 is set to a predetermined value within a range from 3 Hz to 20 Hz, inclusive. For example, the second frequency F2 is set to a predetermined value within a range from 20 Hz to 100 Hz, inclusive. Each of the first high-pass filter 321 and the second high-pass filter 322 is composed of, for example, a fourth order filter. Therefore, the gradient of the attenuation band in the frequency response of the first high-pass filter 321 is 24 dB/Oct. The gradient of the attenuation band in the frequency response of the second high-pass filter 322 is also 24 dB/Oct. As will be understood from the above description, the signal processor 32 according to the first embodiment generates a first signal X1 obtained by reducing components that fall below the first frequency F1 in the audio signal X and a second signal X2 obtained by reducing components that fall below the second frequency F2 in the audio signal X. The second signal X2 is higher than the first frequency F1.

The output controller 33 in FIG. 4 outputs the weighted sum of the first signal X1 output from the first high-pass filter 321 and the second signal X2 output from the second high-pass filter 322, as an audio signal Y0. Specifically, the output controller 33 includes a multiplier 331, a multiplier 332, and an adder 333. The multiplier 331 multiplies the first signal X1 by a weighted value (1−α). The multiplier 332 multiplies the second signal X2 by a weighted value α. The adder 333 adds an output signal from the multiplier 331 and an output signal from the multiplier 332, to generate an audio signal Y0. That is, the audio signal Y0 is expressed by the following Equation (2).

$$Y0 = (1-\alpha)X1 + \alpha \cdot X2 \quad (2)$$

The weighted value α of the second signal X2 takes a numerical value within a range from 0 to 1, inclusive. The weighted value (1−α) of the first signal X1 also takes a numerical value within a range from 0 to 1, inclusive. As one of the weighted value α and the weighted value (1−α) increases, the other one decreases. When the weighted value α is set to 0, the output controller 33 outputs the first signal X1 as an audio signal Y0. This state will be called the "first state" below. On the other hand, when the weighted value α is set to 1, the output controller 33 outputs the second signal X2 as an audio signal Y0. This state will be called the "second state" below. By controlling the weighted value α, the output controller 33 changes from one state to another between the first state and the second state. In the second state, the output controller 33 outputs a second signal X2 having reduced components that fall below the second frequency F2. Therefore, as compared with the first state, the low-frequency component of the audio signal Z, which is supplied from the class-D amplifier 51 to the sound output device 13, is reduced. Consequently, this allows for reduction of the fluctuation in the power supply voltage due to the power supply pumping phenomenon.

As shown in FIG. 4, the control device 21 (an example of "at least one processor") according to the first embodiment executes a program stored in the storage device 22 so as to function as a state determiner 61 and an operation controller 62. A part or all of the functions of the control device 21 may be realized by the signal processing circuit 30.

The state determiner 61 determines whether or not there is an on-going power supply pumping phenomenon in the power source 52. The state determiner 61 according to the first embodiment determines whether or not the power supply pumping phenomenon is actually generated in accordance with the positive power supply voltage Vp and the negative power supply voltage Vm detected by the voltage detector 53 in FIG. 2. Specifically, the state determiner 61 compares a voltage index value Q with a threshold value to determine whether or not there is a power supply pumping phenomenon. Where, the voltage index value Q corresponds to the positive power supply voltage Vp and the negative power supply voltage Vm.

In FIG. 3, the time change of the voltage index value Q is shown in combination with the time change of the positive power supply voltage Vp and the negative power supply voltage Vm. As shown in FIG. 3, the voltage index value Q takes a value obtained by smoothing the larger one of the positive power supply voltage Vp and the absolute value |Vm| of the negative power supply voltage Vm (maximum value max {Vp, |Vm|}) on a time axis. For example, the state determiner 61 calculates a value on the envelope generated by a known envelope filter from the time series of the maximum value max {Vp, |Vm|}, as the voltage index value Q.

As will be understood from the above description, as the positive power supply voltage Vp or the negative power supply voltage Vm fluctuates from a predetermined value by a power supply pumping phenomenon, the voltage index value Q takes a larger numerical value. That is, it is possible to evaluate that the larger voltage index value Q, the higher the probability of the power supply pumping phenomenon. The state determiner 61 according to the first embodiment determines that there is an on-going power supply pumping phenomenon when a voltage index value Q is higher than a first threshold value Ta1. The state determiner 61 determines that the power supply pumping phenomenon has been eliminated when the voltage index value Q is lower than a second threshold value Ta2. As shown in FIG. 3, the first threshold value Ta1 exceeds the second threshold value Ta2 (Ta1>Ta2).

Figure 6:
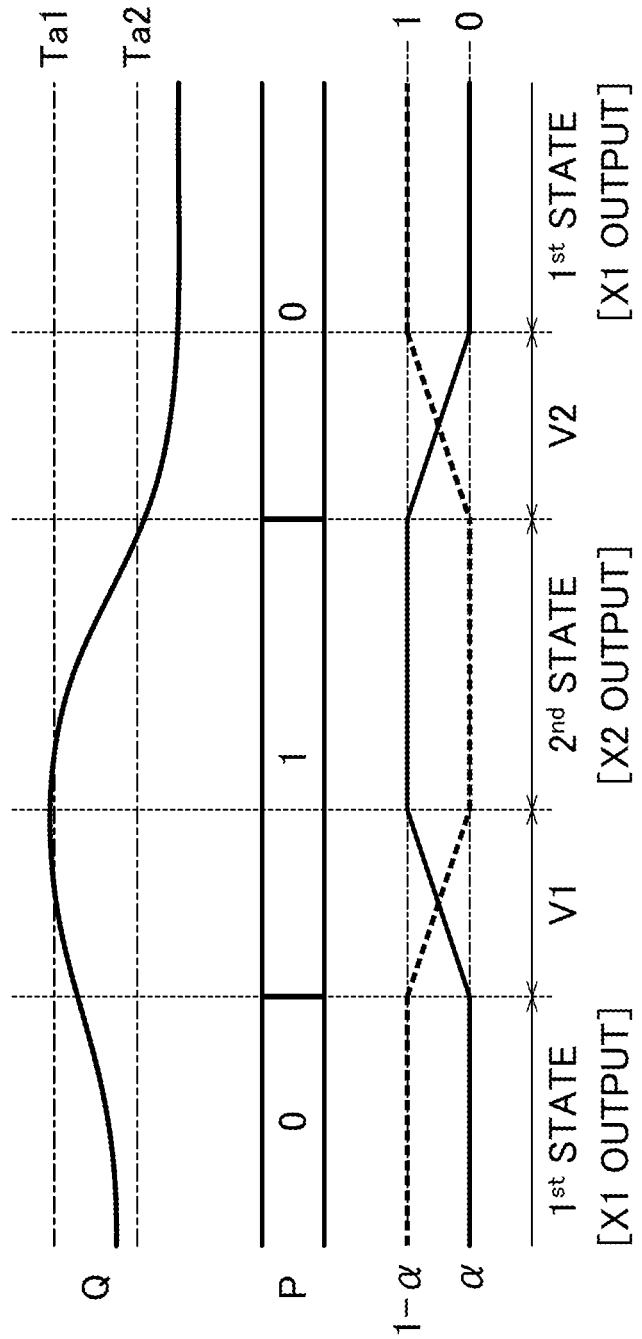
FIG. 6 is an explanatory drawing for explaining operations of a state determiner and an output controller.

FIG. 6 is an explanatory drawing for explaining operations of the state determiner 61 and the output controller 33. FIG. 6 shows a time change of state information P indicating the determination result from the state determiner 61. As shown in FIG. 6, the state determiner 61 sets the state information P to "1" when the voltage index value Q rises across the first threshold value Ta1 (that is, when a power supply pumping phenomenon occurs). The state determiner 61 sets the state information P to "0" when the voltage index value Q is decreased across the second threshold value Ta2 (that is, when the power supply pumping phenomenon is eliminated). That is, the state information P means information (flag) indicating whether or not there is an on-going power supply pumping phenomenon.

The operation controller 62 controls the weighted value α to be applied to the generation of the audio signal Y0 by the output controller 33 in accordance with the determination result from the state determiner 61. As shown in FIG. 6, when the determination result from the state determiner 61 changes from negative to affirmative (that is, when the state information P changes from "0" to "1"), the operation controller 62 increases the weighted value α over time from the start point to the end point of the transition period V1 of the predetermined length. Specifically, in the transition period V1, the weighted value (1−α) of the first signal X1 linearly decreases from 1 to 0, and the weighted value α of the second signal X2 linearly increases from 0 to 1. That is, a cross-fade, in which the fade-out of the first signal X1 and the fade-in of the second signal X2 are parallel to each other, is realized. As shown above, the output controller 33 gradually changes in the transition period V1 from the first state (α=0), in which the first signal X1 is output, 1.5 until the second state (α=1), in which the second signal X2 is output.

On the other hand, when the determination result from the state determiner 61 changes from affirmative to negative (that is, when the state information P changes from "1" to "0"), the operation controller 62 decreases the weighted value α over time from the start point to the end point of the transition period V2 of the predetermined length. Specifically, in the transition period V2, the weighted value (1−α) of the first signal X1 linearly increases from 0 to 1, and the weighted value α of the second signal X2 linearly decreases from 1 to 0. That is, a cross-fade, in which the fade-in of the first signal X1 and the fade-out of the second signal X2 are parallel to each other, is realized. Therefore, the output controller 33 gradually changes in the transition period V2 from the second state (α=1), in which the second signal X2 is output, until the first state (α=0), in which the first signal X1 is output. The time lengths of the transition period V1 and the transition period V2 are freely selectable. For example, the transition period V2 is set to a length that is longer than the transition period V1. Specifically, the transition period V1 is set to a time length of, for example, 10 milliseconds or less. The transition period V2 is set to a time length of, for example, 100 milliseconds or less.

Figure 7:
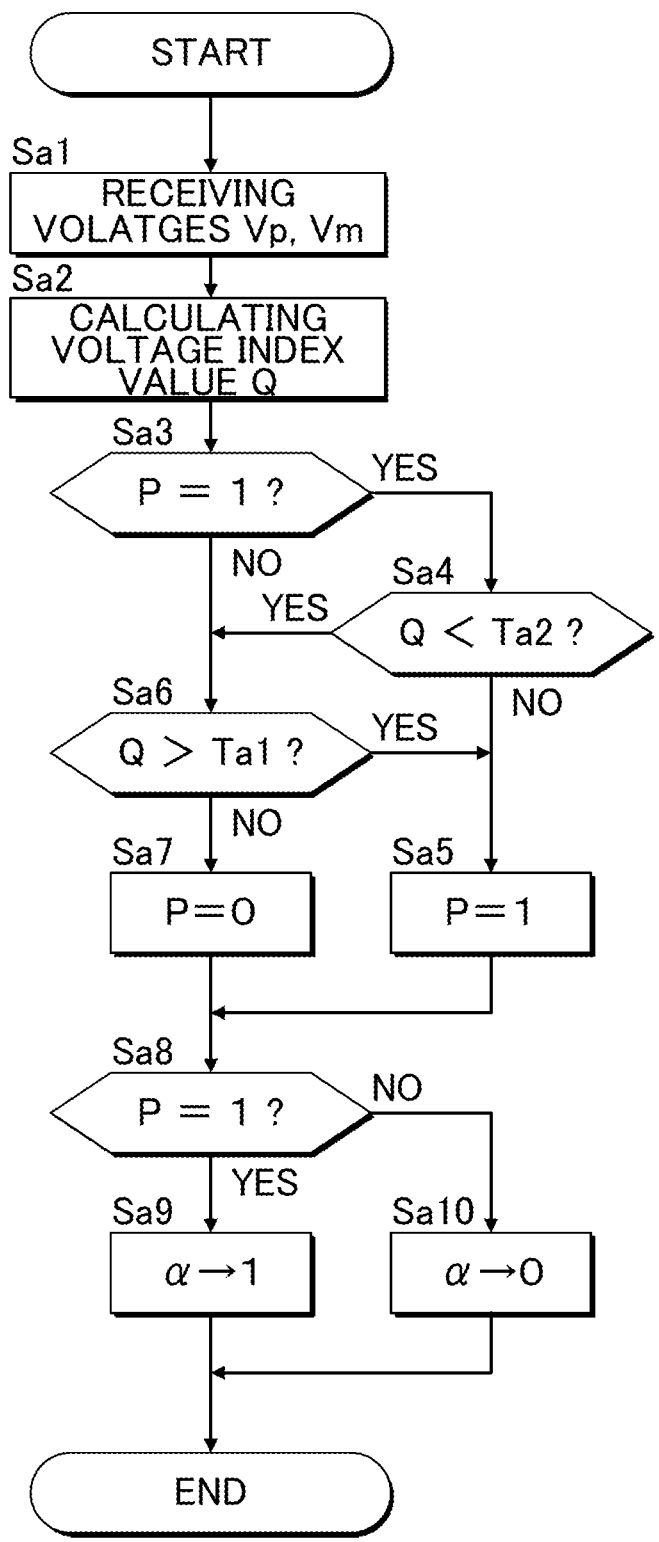
FIG. 7 is a flowchart of an operation performed by the control device.

FIG. 7 is a flowchart of operations performed by the control device 21 (the state determiner 61 and the operation controller 62). For example, the processing shown in FIG. 7 starts as triggered by an interrupt occurring at a predetermined cycle. When the process shown in FIG. 7 is started, the state determiner 61 receives data with respect to the positive power supply voltage Vp and the negative power supply voltage Vm from the voltage detector 53 (Sa1). The state determiner 61 calculates a voltage index value Q in accordance with the positive power supply voltage Vp and the negative power supply voltage Vm (Sa2).

The state determiner 61 determines whether or not the state information P is "1" (Sa3). When the state information P is "1" (Sa3: YES), that is, when the power supply pumping phenomenon has already occurred, the state determiner 61 determines whether or not the voltage index value Q is below the second threshold value Ta2 (Sa4). That is, the state determiner 61 determines whether or not the power supply pumping phenomenon has been eliminated. When the voltage index value Q exceeds the second threshold value Ta2 (Sa4: NO), that is, when the power supply pumping phenomenon is continuing, the state determiner 61 maintains the state information P at "1" (Sa5).

On the other hand, in the state in which the state information P is set to "0" (Sa3: NO), no power supply pumping phenomenon occurs. When the voltage index value Q is below the second threshold value Ta2 in a state in which the state information P is set to "1" (Sa4: YES), it is estimated that the power supply pumping phenomenon which has occurred immediately before is eliminated. In the state in which the power supply pumping phenomenon does not occur (Sa3: NO, Sa4: YES) as described above, the state determiner 61 determines whether or not the voltage index value Q exceeds the first threshold value Ta1 (Sa6).

When the voltage index value Q exceeds the first threshold value Ta1 (Sa6: YES), that is, when a power supply pumping phenomenon occurs, the state determiner 61 sets the state information P to "1" (Sa5). On the other hand, when the voltage index value Q is below the first threshold value Ta1 (Sa6: NO), that is, when the power supply pumping phenomenon does not occur, the state determiner 61 sets the state information P to "0" (Sa7).

In accordance with the above procedure, when the state information P is maintained or updated according to the voltage index value Q, the state determiner 61 determines whether or not the state information P is "1" (Sa8). That is, the state determiner 61 determines whether or not there is an on-going power supply pumping phenomenon in the power source 52.

When the state information P is "1" (Sa8: YES), that is, when there is an on-going power supply pumping phenomenon, the operation controller 62 executes processing for setting the weighted value α to 1 (Sa9). That is, the processing for controlling the output controller 33 to be in the second state is executed. Specifically, when the output controller 33 is already in the second state (α=1), the operation controller 62 maintains the weighted value α at 1. When the output controller 33 is in the first state (α=0), the operation controller 62 increases the weighted value α from 0 to 1 over time from the start point to the end point of the transition period V1, as described with reference to FIG. 6. That is, the output controller 33 changes from the first state to the second state.

On the other hand, when the state information P is "0" (Sa8: NO), that is, when the power supply pumping phenomenon does not occur, the operation controller 62 executes processing for setting the weighted value α to 0 (Sa10). That is, the processing for controlling the output controller 33 to the first state is executed. Specifically, when the output controller 33 is already in the first state (α=0), the operation controller 62 maintains the weighted value α at 0. When the output controller 33 is in the second state (α=1), as described with reference to FIG. 6, the operation controller 62 reduces the weighted value α from 1 to 0 over time from the start point to the end point of the transition period V2. That is, the output controller 33 changes from the second state to the first state.

As described above, the output controller 33 is controlled to be in the first state when the determination result from the state determiner 61 is negative (when the power supply pumping phenomenon does not occur). On the other hand, the output controller 33 is controlled to be in the second state when the determination result from the state determiner 61 is affirmative (when there is an on-going power supply pumping phenomenon). In the second state, the second signal X2, which is obtained by reducing components that fall below the second frequency F2, which is higher than the first frequency F1, is output from the output controller 33. Accordingly, there is reduced fluctuation in the power supply voltage due to the power supply pumping phenomenon as compared with the first state.

In the first embodiment, since the output controller 33 changes from one state to another between the first state and the second state, it is not necessary to change a cutoff frequency of the high-pass filter for processing the audio signal X according to the presence or absence of the power supply pumping phenomenon. Specifically, the first embodiment allows for reduction of the fluctuation in the power supply voltage due to the power supply pumping phenomenon, by the very simple control for changing one weighted value α. Therefore, the first embodiment provides an advantage that there is reduced of load that is applied to the audio processing device 12 and the like to reduce the fluctuation in the power supply voltage due to the power supply pumping phenomenon, as compared with the technique of Patent Document 1 in which the cutoff frequency of the high-pass filter is changed.

Incidentally, due to the difference in frequency response between the first high-pass filter 321 and the second high-pass filter 322 (in particular, phase characteristic), there is a possibility that phases of the first signal X1 and the second signal X2 may be different from each other. Therefore, in the configuration in which the first signal X1 and the second signal X2 are selectively switched by the output controller 33, the level of the audio signal Y0 output from the output controller 33 may fluctuate discontinuously at the time of switching, which may cause noise (for example, a noise "puff"). In the first embodiment, the weighted value α of the second signal X2 decreases over time in parallel to the increase in the weighted value (1−α) of the first signal X1 over time. On the other hand, the weighted value α of the second signal X2 increases over time in parallel to the decrease in the weighted value (1−α) of the first signal X1 over time. That is, the first signal X and the second signal X2 are cross-faded. Therefore, the first embodiment provides another advantage that there is reduced noise caused by a difference in phase between the first signal X1 and the second signal X2.

In addition, presence or absence of occurrence of a power supply pumping phenomenon is determined in accordance with the positive power supply voltage Vp and the negative power supply voltage Vm. Therefore, the first embodiment provides another advantage in that there is effective reduction in fluctuation in the power supply voltage due to the power supply pumping phenomenon actually occurring in the power source 52. In the first embodiment, in particular, the first threshold value Ta1 for detecting the occurrence of the power supply pumping phenomenon exceeds the second threshold value Ta2 for detecting the elimination of the power supply pumping phenomenon. Therefore, there is reduction in probability that a power supply pumping phenomenon is excessively detected, as compared with an audio processing device configured to determine that there is an on-going power supply pumping phenomenon when the voltage index value Q is higher than the second threshold value Ta2. Further, the first embodiment provides another advantage in that there is reduced fluctuation in the power supply voltage due to the power supply pumping phenomenon, as compared with an audio processing device configured to determine that the power supply pumping phenomenon is eliminated when the voltage index value Q is lower than the first threshold value Ta1.

Second Embodiment

A second embodiment according to the present invention will be described. In the embodiments shown in the following, elements having the same actions and functions as in the first embodiment are denoted by the same respective reference numerals as used for like elements in the description of the first embodiment, and detailed description thereof is omitted where appropriate.

As described above with reference to the above-described Equation (1), as the frequency of the audio signal Z output from the class-D amplifier 51 decreases, the probability of the power supply pumping phenomenon occurring increases. Therefore, the higher the intensity (for example, volume or power) of the low-frequency component of the audio signal X supplied from the signal supply device 11, the more likely the power supply pumping phenomenon will occur.

In consideration of the above-described tendency, in the second embodiment an audio processing device determines that there is a possibility that a power supply pumping phenomenon occurs when the intensity of the low-frequency component in the audio signal X is greater than the threshold value. In other words, the audio processing device according to the first embodiment analyze the positive power supply voltage Vp and the negative power supply voltage Vm to detect that the power supply pumping phenomenon is actually occurring. In contrast, the audio processing device according to the second embodiment analyzes the low-frequency component of the audio signal X, to determine whether or not there is a possibility that a power supply pumping phenomenon occurs (that is, irrespective of whether or not the power supply pumping phenomenon is actually generated). In the second embodiment, there are omitted the configuration and operation using the positive power supply voltage Vp and the negative power supply voltage Vm to reduce fluctuation in the power supply voltage due to the power supply pumping phenomenon. For example, the voltage detector 53 shown in the first embodiment is omitted.

Figure 8:
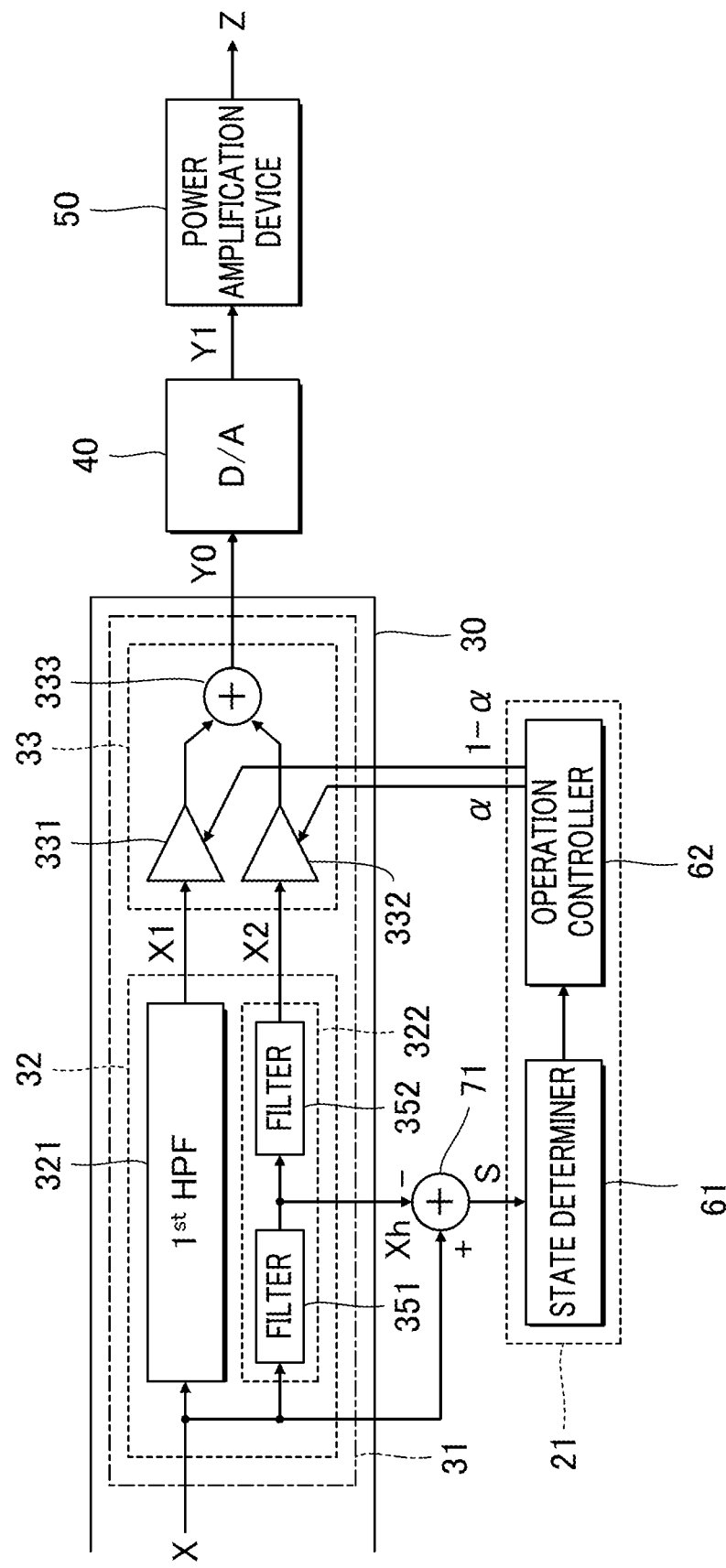
FIG. 8 is a block diagram of an element for reducing fluctuations in a power supply voltage due to a power supply pumping phenomenon in a second embodiment.

FIG. 8 is a block diagram of elements related to reduction of fluctuation in power supply voltage due to a power supply pumping phenomenon in the audio processing device 12 according to the second embodiment. Similarly to the first embodiment, the second high-pass filter 322 of the signal processor 32 in the second embodiment outputs the second signal X2 by reducing the components that fall below the second frequency F2 in the audio signal X. As shown in FIG. 8, the second high-pass filter 322 is a fourth-order filter consisting of a second-order filter 351 and a second-order filter 352. The second signal X2 output from the downstream filter 352 is supplied to the output controller 33.

As shown in FIG. 8, the audio processing device 12 according to the first embodiment includes a subtractor circuit 71. The subtractor circuit 71 subtracts the high-frequency signal Xh, which is output from the filter 351 of the second high-pass filter 322, from the audio signal X before processing by the second high-pass filter 322, to generate a low-frequency signal S. The high-frequency signal Xh output from the filter 351 corresponds to a high-frequency component that is higher than the second frequency F2 of the audio signal X. Therefore, the low-frequency signal S generated by subtracting the high-frequency signal Xh from the audio signal X corresponds to a low-frequency component that falls below the second frequency F2 of the audio signal X. It is also possible to supply the second signal X2 output from the second high-pass filter 322 (filter 352) to the subtractor circuit 71 as the high-frequency signal Xh.

The state determiner 61 according to the second embodiment determines whether or not there is a possibility that a power supply pumping phenomenon occurs in accordance with the intensity (hereinafter referred to as "low-frequency intensity") L of the low-frequency component in the audio signal X. Specifically, the state determiner 61 compares the low-frequency intensity L of the low-frequency signal S generated by the subtractor circuit 71 with a threshold value, to determine whether or not there is a possibility that a power supply pumping phenomenon occurs. The low-frequency intensity L takes a numerical value on an envelope generated by a known envelope filter, for example, from the low-frequency signal S. As described above, the greater the low-frequency intensity L, the more likely the power supply pumping phenomenon is to occur. In consideration of the above tendency, the state determiner 61 according to the second embodiment determines that there is a possibility that a power supply pumping phenomenon occurs when the low-frequency intensity L is higher than the predetermined threshold value Tb.

Figure 9:
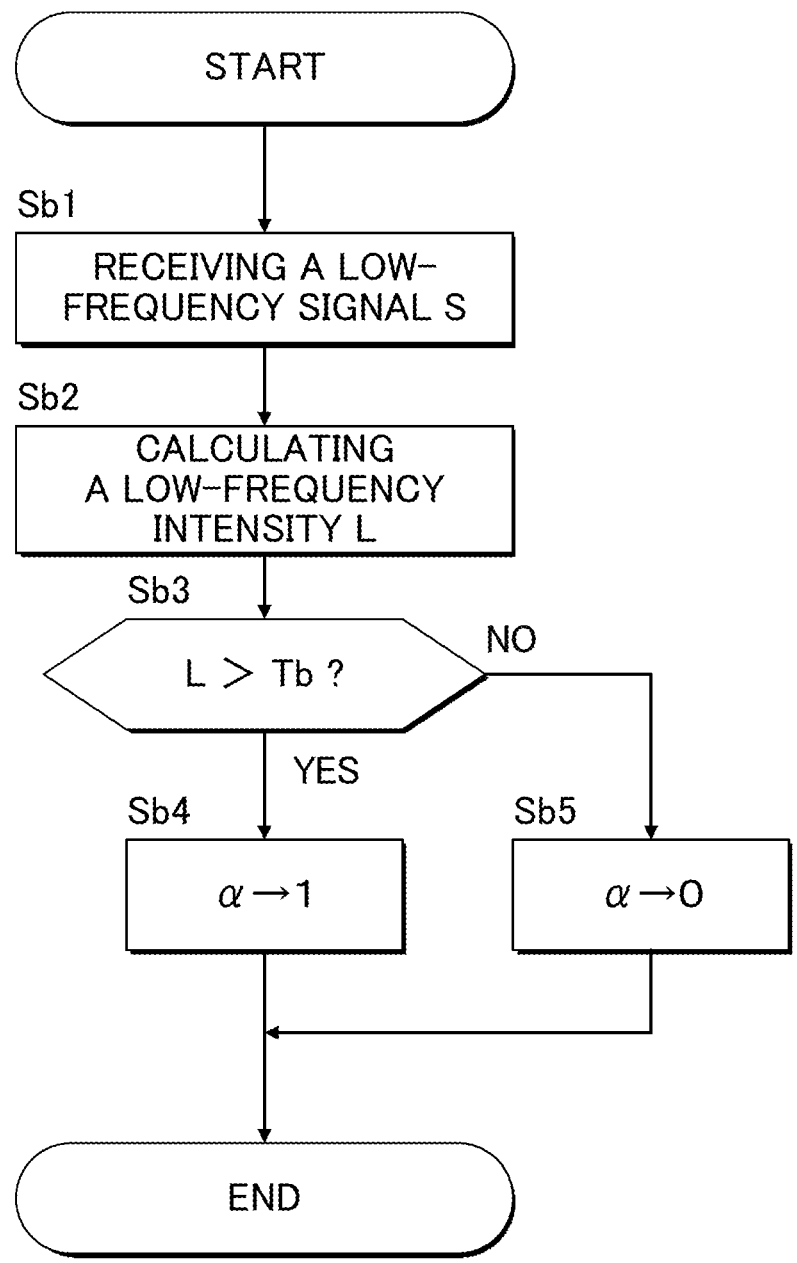
FIG. 9 is a flowchart of an operation performed by the control device according to the second embodiment.
Figure 10:
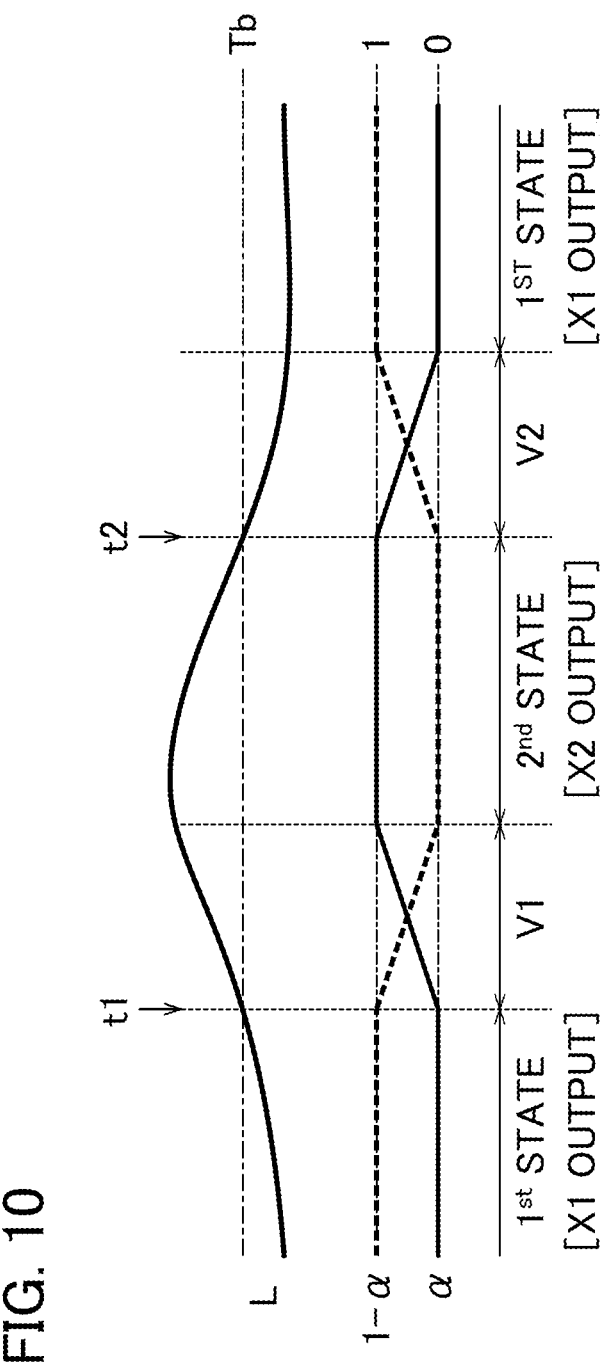
FIG. 10 is an explanatory drawing for explaining operations of the state determiner and the output controller in the second embodiment.

FIG. 9 is a flowchart of operations performed by the control device 21 (the state determiner 61 and the operation controller 62) according to the second embodiment. FIG. 10 is an explanatory drawing for explaining the operation of the control device 21. For example, the processing shown in FIG. 9 starts as triggered by an interrupt generated at a predetermined cycle. When the processing in FIG. 9 starts, the state determiner 61 takes in the low-frequency signal S generated by the subtractor circuit 71 (Sb1), and calculates the low-frequency intensity L (Sb2).

The state determiner 61 determines whether or not the low-frequency intensity L exceeds the threshold value Tb (Sb3). When the low-frequency intensity L exceeds the threshold value Tb (Sb3: YES), that is, when there is a possibility that a power supply pumping phenomenon occurs, the operation controller 62 executes processing for setting the weighted value α to 1 (Sb4). That is, the operation controller 62 executes the processing for controlling the output controller 33 to be in the second state. Specifically, when the output controller 33 is already in the second state (α=1), the operation controller 62 maintains the weighted value α at 1. When the output controller 33 is in the first state (α=0), as shown in FIG. 10, the operation controller 62 changes the weighted value α from 0 to 1 over time from the start point to the end point of the transition period V1 of the predetermined length. That is, the output controller 33 changes from the first state to the second state.

On the other hand, when the low-frequency intensity L is below the threshold value Tb, (Sb3: NO), that is, when it is estimated that the power supply pumping phenomenon does not occur, the operation controller 62 executes processing for setting the weighted value α to 0 (Sb5). That is, the processing for controlling the output controller 33 to the first state is executed. Specifically, when the output controller 33 is already in the first state ($\alpha=0$), the operation controller 62 maintains the weighted value $\alpha$ at 0. On the other hand, when the output controller 33 is in the second state ($\alpha=1$), as shown in FIG. 10, the operation controller 62 reduces the weighted value $\alpha$ from 1 to 0 over time from the start point to the end point of the transition period V2 of the predetermined length. That is, the output controller 33 changes from the second state to the first state.

As described above, in the second embodiment, the output controller 33 changes from one state to another between the first state and the second state by a simple control for changing the weighted value $\alpha$. Therefore, as in the first embodiment, the second embodiment provides an advantage in that there is reduction of load that is applied to the audio processing device and the like to reduce fluctuation in the power supply voltage due to the power supply pumping phenomenon, as compared with the technique of Patent Document 1 in which the cutoff frequency of the high-pass filter is changed. Further, since the first signal X1 and the second signal X2 are cross-faded, as in the case of the first embodiment, the second embodiment provides another advantage in that there is reduced noise caused by the difference in phase between the first signal X1 and the second signal X2.

In the second embodiment, when the intensity of the low-frequency component in the audio signal X (low-frequency intensity L) exceeds the threshold value Tb, it is determined that there is a possibility that a power supply pumping phenomenon occurs. Therefore, even when the power supply pumping phenomenon is not actually generated, it is possible to execute processing for reducing fluctuations in the power supply voltage due to the power supply pumping phenomenon (processing for controlling the output controller 33 to the second state). That is, according to the second embodiment, it is possible to prevent the occurrence of a power supply pumping phenomenon.

Modifications

The embodiments described above may be modified in various ways. Examples of specific modifications will now be described. Two or more modes selected freely among the following may also be combined.

(1) In the above-described embodiment, the first signal X1 and the second signal X2 are cross-faded. However, in a case in which noise due to the phase difference between the first signal X1 and the second signal X2 does not cause any particular problem, the output controller 33 may selectively output the first signal X1 and the second signal X2 as the audio signal Y0. That is, there are omitted the calculation of the weighted sum of the first signal X1 and the second signal X2, and the cross fade between the first signal X1 and the second signal X2.

For example, there is used, as the output controller 33, a switch for selecting either of the first signal X1 and the second signal X2. The operation controller 62 controls the output controller 33 so that, when the determination result from the state determiner 61 is affirmative, the output controller 33 is in the first state in which the first signal X1 is output. On the other hand, the operation controller 62 controls the output controller 33 so that, when the determination result is negative, the output controller 33 is in the second state in which the second signal X2 is output. Also in the above configuration, as compared with the technique of Patent Document 1 in which the cutoff frequency of the high-pass filter is changed, there is reduction of load that is applied to the audio processing device 12 and the like to reduce the fluctuation in the power supply voltage due to the power supply pumping phenomenon. As will be understood from the above description, the operation controller 62 according to the aspect of the present invention is expressed comprehensively as an element configured to control the output controller 33 to be in the first state when the determination result from the state determiner 61 is negative, and control the output controller 33 to be in the second state when the determination result is affirmative. There is basically preferred an audio processing device that is configured to gradually change from one state to another between the first state and the second state. However, the audio processing device may instantaneously change from one state to another between the first state and the second state.

Figure 11:
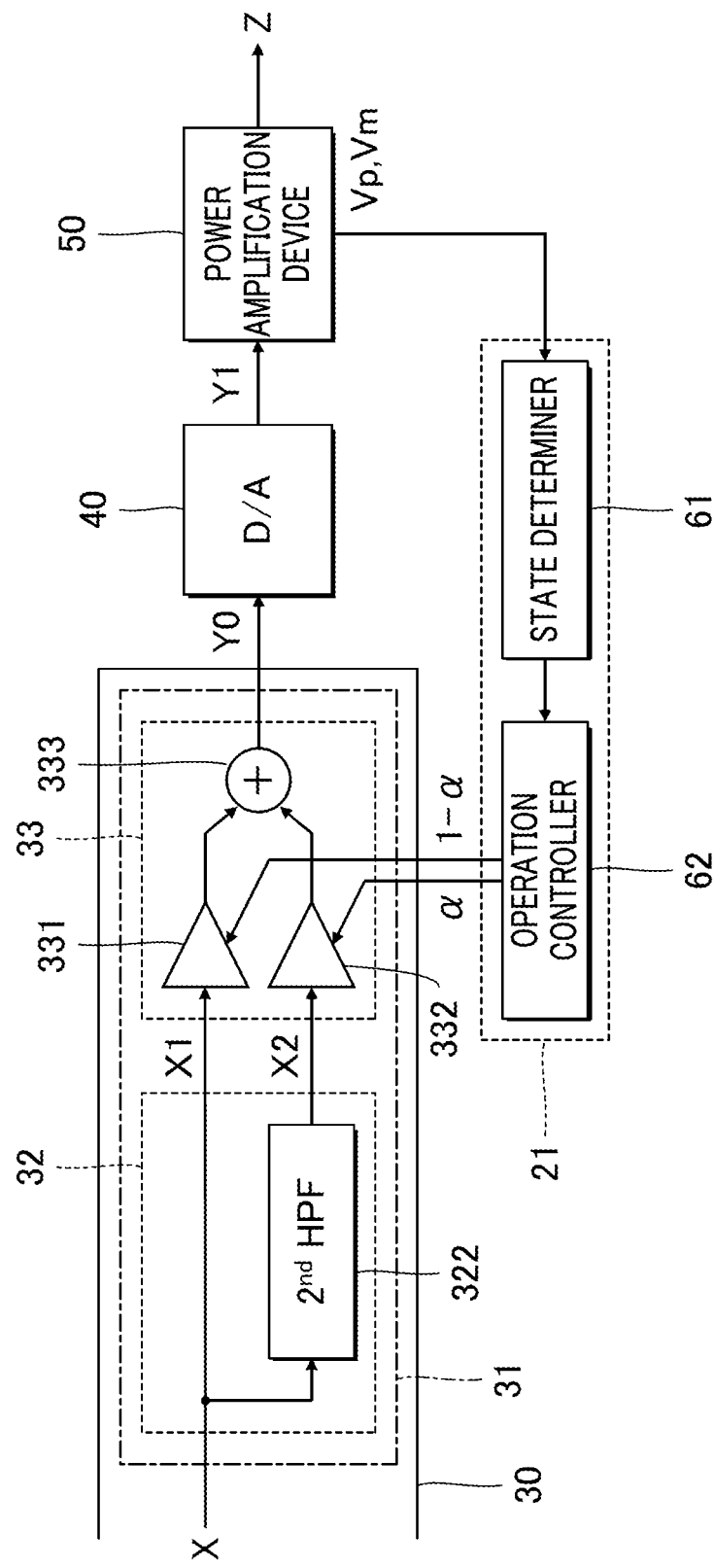
FIG. 11 is a block diagram of an audio processing device according to a modification.

(2) In each embodiment described above, the signal processor 32 is provided with the first high-pass filter 321 and the second high-pass filter 322. However, the first high-pass filter 321 may be omitted. For example, in an audio processing device configured to reduce components that fall below the first frequency F1 in the signal processing before the processing by the low-frequency reducer 31, the first high-pass filter 321 is omitted from the low-frequency reducer 31 as shown in FIG. 11. That is, the output controller 33 receives a supply of the audio signal X, as an audio signal X1, having reduced components that fall below the first frequency F1.

Figure 12:
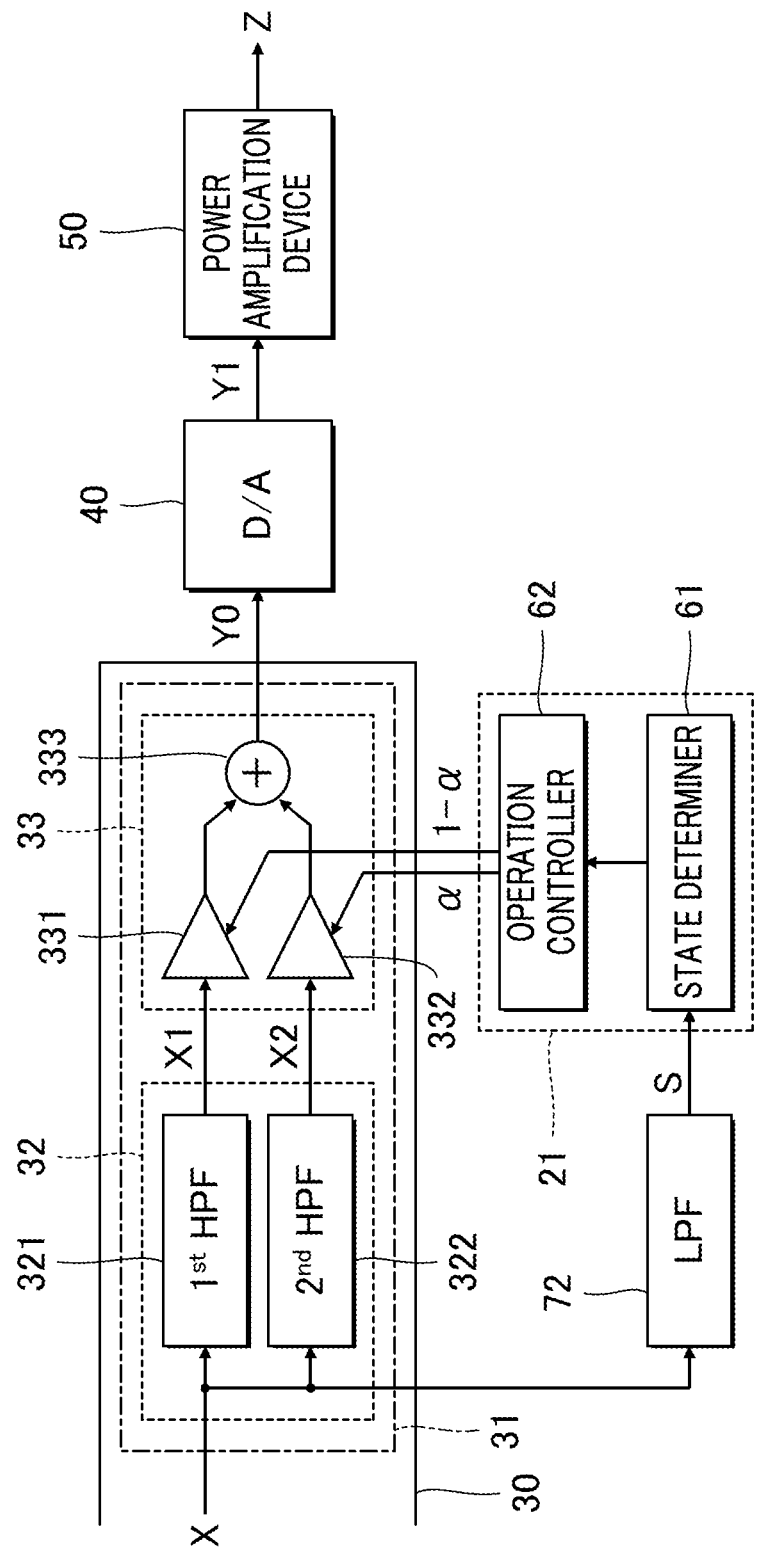
FIG. 12 is a block diagram of an audio processing device according to a modification.

(3) In the second embodiment, a part (filter 351) of the second high-pass filter 322 is used both for generating the second signal X2 and for generating the low-frequency signal S. However, the low-frequency signal S may be generated by an element separate from the generation of the second signal X2. For example, as shown in FIG. 12, there may be provided a Low-Pass Filter (LPF) 72 that is separate from the first high-pass filter 321. The Low-Pass Filter 72 may generate a low-frequency signal S from which the low-frequency component of the audio signal X is extracted. The low-pass filter 72 generates a low-frequency signal S representing, for example, a low-frequency component that falls below the first frequency F1 or the second frequency F2 (for example, a component that falls below a suitable frequency within a range from 3 Hz to 100 Hz, inclusive). In the second embodiment described above, the second high-pass filter 322 (filter 351) for generating the second signal X2 from the audio signal X is used to generate the low-frequency signal S used for determining the power supply pumping phenomenon. Therefore, there is an advantage in that the configuration of the audio processing device 12 is simplified, as compared with the configuration of the audio processing device, as shown in FIG. 12, that generates the low-frequency signal S using the low-pass filter 72 that is separate from the second high-pass filter 322.

The subtractor circuit 71 may receive a supply of the first signal X1 generated by the first high-pass filter 321 as the high-frequency signal Xh. Alternatively, the subtractor circuit 71 may receive a supply of a signal generated by some filters constituting first-order high-pass filters 321 (for example, a filter other than the last stage) as the high-frequency signal Xh. In the above configuration, the low-frequency signal S, which represents a low-frequency component that falls below the first frequency F1, is generated by the subtractor circuit 71.

(4) In each of the above-described embodiments, the weighted value $(1-\alpha)$ of the first signal X1 and the weighted value $\alpha$ of the second signal X2 are linearly varied; however, the aspects of the variation of the weighted value $\alpha$ and the weighted value $(1-\alpha)$ are not limited to the above example. Specifically, each of the weighted value $\alpha$ and the weighted value $(1-\alpha)$ may be changed in a curved manner. In each of the above-described embodiments, the weighted value α is changed from 0 to 1; however, the minimum value of the weighted value α (an example of the second value) and the maximum value (an example of the first value) are not limited to the above examples. For example, the minimum value of the weighted value α may be set to a positive number close to 0 (for example, 0.1) Alternatively, for example, the maximum value of the weighted value α may be set to a value close to 1 (for example, 0.9).

(5) In the first embodiment, the state determiner determines whether or not the power supply pumping phenomenon is actually generated based on the voltage index value Q. This determination will be called the "first determination". In the second embodiment, the state determiner determines whether or not there is a possibility that a power supply pumping phenomenon occurs in accordance with the low-frequency intensity L of the audio signal X. This determination will be called the "second determination". However, the first determination and the second determination may also be used in combination. Specifically, the state determiner 61 determines whether or not the power supply pumping phenomenon is actually generated in accordance with the positive power supply voltage Vp and the negative power supply voltage Vm (first determination), and whether or not there is a possibility that a power supply pumping phenomenon occurs, according to the low-frequency signal S (second determination). The operation controller 62 controls the output controller 33 to be in the second state when at least one of results of the first determination and the second determination is affirmative, and controls the output controller 33 to be in the first state when both the results of the first determination and the second determination are negative.

(6) For example, the following aspect is understood from the foregoing embodiments.

Aspect 1

An audio processing device according to an aspect of the present invention includes: at least one processor configured to: generate a first signal by reducing components that fall below a first frequency in an audio signal; generate a second signal by reducing components that fall below a second frequency that is higher than the first frequency in the audio signal; select between a first state for outputting the first signal and a second state for outputting the second signal: and output one of the selected first or second signal as an output signal; and a class-D amplifier configured to amplify the output signal, in which, the at least one processor is further configured to: determine whether or not a power supply pumping phenomenon exists or a possibility of the power supply pumping phenomenon exists, in a power source that supplies a power supply voltage to the class-D amplifier; and in which in the selecting between the first state and the second state, the at least one processor is configured to select: the first state in a case where a determination result is negative, where the power supply pumping phenomenon is determined to not exist or the possibility of the power supply pumping phenomenon is determined to not exist; and the second state in a case where the determination result is affirmative, where the power supply pumping phenomenon is determined to exist or the possibility of the power supply pumping phenomenon is determined to exist.

In the aspect described above, when the determination result is negative (specifically, when the power supply pumping phenomenon does not occur in the power source or when there is no possibility that a power supply pumping phenomenon occurs), the at least one processor selects the first state. On the other hand, when the determination result is affirmative (specifically, when a power supply pumping phenomenon occurs in the power source or when there is a possibility that a power supply pumping phenomenon occurs), the at least one processor selects the second state. The more the low-frequency component of the audio signal is dominant, the more likely the power supply pumping phenomenon occurs. In the second state, the at least one processor outputs the second signal, which is obtained by reducing components that fall below the second frequency that is higher than the first frequency. This allows for reduction of fluctuation in the power supply voltage due to the power supply pumping phenomenon as compared with the first state. Since the at least one processor selects between the first state and the second state, it is not necessary to change the cutoff frequency of the high-pass filter for processing the audio signal according to the presence or absence of the power supply pumping phenomenon. Therefore, there is an advantage in that there is reduction of load that is applied to the audio processing device and the like to reduce fluctuation in the power supply voltage due to the power supply pumping phenomenon.

Aspect 2

In the example 1 (Aspect 2), the at least one processor is configured to: output a weighted sum of the first signal and the second signal, in the first state, a weighted value of the first signal is set to a first value, and a weighted value of the second signal is set to a second value that is below the first value; in the second state, the weighted value of the first signal is set to the second value, and the weighted value of the second signal is set to the first value; and control the weighted value of the first signal and the weighted value of the second signal.

In the aspect described above, the at least one processor selects between the first state and the second state by controlling the weighted values of the first signal and the second signal. Therefore, there is an advantage that there can be reduction in the fluctuation in the power supply voltage due to the power supply pumping phenomenon by simple control of changing the weighted values.

Aspect 3

In the example of Aspect 2 (Aspect 3), the at least one processor is configured to change: the weighted value of the first signal from the first value to the second value over time and changes the weighted value of the second signal from the second value to the first value over time, in a case where the determination result changes from the negative to the affirmative; and the weighted value of the first signal from the second value to the first value over time and changes the weighted value of the second signal from the first value to the second value over time, in a case when the determination result changes from the affirmative to the negative.

In the aspect described above, the weighted value of the second signal decreases over time in parallel with the increase in the weighted value of the first signal over time, and the weighted value of the second signal increases over time in parallel with the decrease in the weighted value of the first signal over time. That is, the first signal and the second signal are cross-faded. Therefore, there is an advantage that there can be reduction in noise caused by a difference in phase between the first signal and the second signal.

In the example of any one of Aspects 1 to 3, the at least one processor is configured to determine whether or not the power supply pumping phenomenon exists in accordance with the power supply voltage supplied from the power source to the class-D amplifier.

In the aspect described above, there is reduction in fluctuations in the power supply voltage due to the power supply pumping phenomenon when the power supply pumping phenomenon is actually generated.

Aspect 4

In the example of Aspect 1 (Aspect 4), the at least one processor is configured to determine: the affirmative in a case where a voltage index value corresponding to the power supply voltage is higher than a first threshold value; and the negative in a case where the voltage index value is lower than a second threshold value that is below the first threshold value.

In the aspect described above, the first threshold value for determining that there is an on-going power supply pumping phenomenon exceeds the second threshold value for determining that the power supply pumping phenomenon has been eliminated. Therefore, as compared with a configuration in which it is determined that there is an on-going power supply pumping phenomenon when the voltage index value is higher than the second threshold value, there is reduction in the probability that a power supply pumping phenomenon is excessively detected. Further, there is an advantage that there is sufficiently reduced fluctuation in the power supply voltage due to the power supply pumping phenomenon as compared with a configuration in which the power supply pumping phenomenon is determined to be eliminated when the voltage index value is lower than the first threshold value.

Aspect 5

In the example of any one of Aspects 1 to 3 (Aspect 5), the at least one processor is configured to determine the affirmative in a case where an intensity of a low-frequency component in the audio signal is greater than a threshold value.

In this configuration, the processing for suppressing the fluctuation is executed after the power supply voltage is actually fluctuated due to the power supply pumping phenomenon. In contrast to this configuration described above, in the aspect described above, the state determiner determines that a power supply pumping phenomenon occurs when the intensity of the low-frequency component in the audio signal is greater than the threshold value. According to this aspect, even when the power supply pumping phenomenon is not actually generated, there is executed processing for reducing fluctuations in the power supply voltage due to the power supply pumping phenomenon (processing for controlling the output controller to be in the second state). Therefore, there is an advantage in that there is reduced occurrence (ideally, prevention) of a power supply pumping phenomenon in advance.

Aspect 6

In the example of Aspect 5 (Aspect 6), the at least one processor includes: a high-pass filter that generates the second signal by reducing components that fall below the second frequency in the audio signal; and a subtractor circuit that subtracts, from the audio signal, a signal processed by the high-pass filter, to generate a signal having the low-frequency component.

In the aspect described above, there is used a high-pass filter which outputs a second signal by reducing components that fall below the second frequency in the audio signal, to generate signal having a low-frequency component used for determining a power supply pumping phenomenon. Therefore, there is an advantage in that the configuration of the audio processing device is simplified as compared with a configuration for generating a signal of a low-frequency component for determining a power supply pumping phenomenon by an element separate from the high-pass filter.

Aspect 7

In the example of any one of Aspects 1 to 6 (Aspect 7), the at least one processor includes: a first high-pass filter configured to generate the first signal by reducing components that fall below the first frequency in the audio signal; and a second high-pass filter configured to generate the second signal by reducing components that fall below the second frequency in the audio signal.

Aspect 8

In a method of controlling an audio processing device according to an example (Aspect 8) of the present invention, the audio processing device includes: at least one processor configured to: generate a first signal by reducing components that fall below a first frequency in an audio signal; generate a second signal by reducing components that fall below a second frequency that is higher than the first frequency in the audio signal; select between a first state for outputting the first signal and a second state for outputting the second signal; and output one of the selected first or second signal as an output signal, and a class-D amplifier configured to amplify the output signal, in which the method includes: determining whether or not a power supply pumping phenomenon exists or a possibility of the power supply pumping phenomenon exists, in a power source that supplies a power supply voltage to the class-D amplifier; selecting the first state in a case where a determination result is negative, where the power supply pumping phenomenon is determined to not exist or the possibility of the power supply pumping phenomenon is determined to not exist; and selecting the second state in a case where the determination result is affirmative, where the power supply pumping phenomenon is determined to exist or the possibility of the power supply pumping phenomenon is determined to exist.

In the aspect described above, when the determination result is negative (specifically, when the power supply pumping phenomenon does not occur in the power source or when there is no possibility that a power supply pumping phenomenon occurs), the at least one processor selects the first state. On the other hand, when the determination result is affirmative (specifically, when a power supply pumping phenomenon occurs in the power source or when there is a possibility that a power supply pumping phenomenon occurs), the at least one processor selects the second state. In the second state, the at least one processor outputs the second signal, which is obtained by reducing components that fall below the second frequency that is higher than the first frequency. This allows for reduction of fluctuation in the power supply voltage due to the power supply pumping phenomenon as compared with the first state. Since the at least one processor selects between the first state and the second state, it is not necessary to change the cutoff frequency of the high-pass filter for processing the audio signal according to the presence or absence of the power supply pumping phenomenon. Therefore, there is an advantage in that there is reduction of load that is applied to the audio processing device 12 and the like to reduce fluctuation in the power supply voltage due to the power supply pumping phenomenon.

DESCRIPTION OF REFERENCE SIGNS

100 audio system;
11 signal supply device;
12 audio processing device;
13 sound output device;

20 control unit; 21 control device;
22 storage device;
51 class-D amplifier;
511 modulation circuit;
512 switching circuit;
513 low-pass filter;
52 power source;
521 positive power supply;
522 negative power supply;
523, 524 smoothing capacitor,
31 low-frequency reducer;
32 signal processor;
321 first high-pass filter,
322 second high-pass filter;
33 output controller;
331, 332 multiplier;
333 adder;
61 state determiner;
62 operation controller;
71 subtractor circuit;
72 low-pass filter

What is claimed is:

1. An audio processing device comprising:
at least one processor configured to:
generate a first signal by reducing components that fall below a first frequency in an audio signal;
generate a second signal by reducing components that fall below a second frequency that is higher than the first frequency in the audio signal;
select between a first state for outputting the first signal and a second state for outputting the second signal; and
output one of the selected first or second signal as an output signal; and
a class-D amplifier configured to amplify the output signal,
wherein the at least one processor is further configured to:
determine whether or not a power supply pumping phenomenon exists or a possibility of the power supply pumping phenomenon exists, in a power source that supplies a power supply voltage to the class-D amplifier, and
wherein in the selecting between the first state and the second state, the at least one processor is configured to select:
the first state in a case where a determination result is negative, where the power supply pumping phenomenon is determined to not exist or the possibility of the power supply pumping phenomenon is determined to not exist; and
the second state in a case where the determination result is affirmative, where the power supply pumping phenomenon is determined to exist or the possibility of the power supply pumping phenomenon is determined to exist.

2. The audio processing device according to claim 1, wherein the at least one processor is configured to:
output a weighted sum of the first signal and the second signal,
in the first state, a weighted value of the first signal is set to a first value, and a weighted value of the second signal is set to a second value that is below the first value;
in the second state, the weighted value of the first signal is set to the second value, and the weighted value of the second signal is set to the first value; and
control the weighted value of the first signal and the weighted value of the second signal.

3. The audio processing device according to claim 2, wherein the at least one processor is configured to change:
the weighted value of the first signal from the first value to the second value over time and changes the weighted value of the second signal from the second value to the first value over time, in a case where the determination result changes from the negative to the affirmative; and
the weighted value of the first signal from the second value to the first value over time and changes the weighted value of the second signal from the first value to the second value over time, in a case when the determination result changes from the affirmative to the negative.

4. The audio processing device according to claim 1, wherein the at least one processor is configured to determine:
the affirmative in a case where a voltage index value corresponding to the power supply voltage is higher than a first threshold value; and
the negative in a case where the voltage index value is lower than a second threshold value that is below the first threshold value.

5. The audio processing device according to claim 1, wherein the at least one processor is configured to determine the affirmative in a case where an intensity of a low-frequency component in the audio signal is greater than a threshold value.

6. The audio processing device according to claim 5, wherein the at least one processor includes:
a high-pass filter that generates the second signal by reducing components that fall below the second frequency in the audio signal; and
a subtractor circuit that subtracts, from the audio signal, a signal processed by the high-pass filter, to generate a signal having the low-frequency component.

7. The audio processing device according to claim 1, wherein the at least one processor includes:
a first high-pass filter configured to generate the first signal by reducing components that fall below the first frequency in the audio signal; and
a second high-pass filter configured to generate the second signal by reducing components that fall below the second frequency in the audio signal.

8. A method of controlling an audio processing device including:
at least one processor configured to:
generate a first signal by reducing components that fall below a first frequency in an audio signal;
generate a second signal by reducing components that fall below a second frequency that is higher than the first frequency in the audio signal;
select between a first state for outputting the first signal and a second state for outputting the second signal; and
output one of the selected first or second signal as an output signal, and
a class-D amplifier configured to amplify the output signal,
wherein the method comprises:
determining whether or not a power supply pumping phenomenon exists or a possibility of the power supply pumping phenomenon exists, in a power source that supplies a power supply voltage to the class-D amplifier, selecting the first state in a case where a determination result is negative, where the power supply pumping phenomenon is determined to not exist or the possibility of the power supply pumping phenomenon is determined to not exist; and selecting the second state in a case where the determination result is affirmative, where the power supply pumping phenomenon is determined to exist or the possibility of the power supply pumping phenomenon is determined to exist.

* * * * *